United States Patent
Choi et al.

(10) Patent No.: US 12,255,050 B2
(45) Date of Patent: Mar. 18, 2025

(54) ANTENNA MEMBER AND APPARATUS FOR TREATING SUBSTRATE

(71) Applicant: SEMES CO., LTD., Cheonan-si (KR)

(72) Inventors: Yoon Seok Choi, Suwon-si (KR); Yun Sang Kim, Seongnam-si (KR); Sun Wook Jung, Hwaseong-si (KR)

(73) Assignee: Semes Co., Ltd., Chungcheongnam-do (KR)

( * ) Notice: Subject to any disclaimer, the term of this patent is extended or adjusted under 35 U.S.C. 154(b) by 227 days.

(21) Appl. No.: 17/968,179

(22) Filed: Oct. 18, 2022

(65) Prior Publication Data
US 2023/0124184 A1 Apr. 20, 2023

(30) Foreign Application Priority Data
Oct. 20, 2021 (KR) .................. 10-2021-0139990

(51) Int. Cl.
*H01J 37/32* (2006.01)
*H01L 21/683* (2006.01)
*H01Q 7/00* (2006.01)

(52) U.S. Cl.
CPC ..... *H01J 37/3211* (2013.01); *H01J 37/32119* (2013.01); *H01L 21/6831* (2013.01); *H01Q 7/00* (2013.01)

(58) Field of Classification Search
None
See application file for complete search history.

(56) References Cited

U.S. PATENT DOCUMENTS

| | | | | |
|---|---|---|---|---|
| 5,556,501 A | * | 9/1996 | Collins | H01J 37/32458 257/E21.252 |
| 5,763,851 A | * | 6/1998 | Forster | H01J 37/32477 204/298.11 |
| 5,888,414 A | * | 3/1999 | Collins | H01J 37/32165 257/E21.252 |
| 5,964,949 A | * | 10/1999 | Savas | H01J 37/32458 156/345.48 |
| 7,673,583 B2 | * | 3/2010 | Brcka | H01J 37/321 156/345.48 |

(Continued)

FOREIGN PATENT DOCUMENTS

JP 2004-537839 A 12/2004
KR 10-2004-0021808 A 3/2004

*Primary Examiner* — Srinivas Sathiraju
(74) *Attorney, Agent, or Firm* — Harness, Dickey & Pierce, P.L.C.

(57) ABSTRACT

The inventive concept provides an antenna member. In an embodiment, the antenna member includes a first coil and a second coil which have a rotational symmetry to each other, and wherein the first coil includes a first supply terminal applied with a current and a first ground terminal connected to the ground, the second coil includes a second supply terminal applied with the current and a second ground terminal connected to the ground, and wherein the first coil and the second coil each include a first portion having an arc-shape and a second portion having an arc-shape which as a whole form one winding, and when seen from a side, the second portion has a relatively lower height than the first portion, and the second portion of the second coil is positioned below the first portion of the first coil, and the second portion of the first coil is positioned below the first portion of the second coil.

18 Claims, 6 Drawing Sheets

(56) References Cited

U.S. PATENT DOCUMENTS

| | | | | |
|---|---|---|---|---|
| 7,810,449 B2* | 10/2010 | Brcka | ................... | H01J 37/321 |
| | | | | 216/68 |
| 8,028,655 B2* | 10/2011 | Brcka | ................... | H01J 37/321 |
| | | | | 118/723 AN |
| 9,496,121 B2* | 11/2016 | Kim | ...................... | H01J 37/3211 |
| 2003/0089681 A1* | 5/2003 | Blalock | ............ | H01J 37/32174 |
| | | | | 216/68 |
| 2004/0182319 A1* | 9/2004 | Kim | ...................... | H01J 37/321 |
| | | | | 118/723 I |
| 2005/0103445 A1* | 5/2005 | Brcka | ................... | H01J 37/321 |
| | | | | 156/345.48 |
| 2006/0231030 A1* | 10/2006 | Brcka | ................... | H01J 37/321 |
| | | | | 118/723 I |
| 2008/0138992 A1* | 6/2008 | DiVergilio | ........... | H01Q 21/061 |
| | | | | 156/345.48 |
| 2010/0025384 A1* | 2/2010 | Todorow | .................. | H05H 1/46 |
| | | | | 219/121.54 |
| 2010/0194281 A1* | 8/2010 | Carter | ................... | H01J 37/321 |
| | | | | 315/111.71 |
| 2011/0097901 A1* | 4/2011 | Banna | ................... | H01J 37/3211 |
| | | | | 438/758 |
| 2011/0146911 A1* | 6/2011 | Brcka | ................... | H01J 37/321 |
| | | | | 156/345.48 |
| 2012/0305527 A1* | 12/2012 | Kim | ....................... | H01Q 21/06 |
| | | | | 343/757 |
| 2012/0329283 A1* | 12/2012 | Brcka | ................. | H01J 37/3244 |
| | | | | 438/758 |
| 2013/0015757 A1* | 1/2013 | Hegde | ............... | H01J 37/32669 |
| | | | | 313/231.31 |
| 2013/0270997 A1* | 10/2013 | Zhao | ....................... | H05H 1/46 |
| | | | | 216/68 |
| 2014/0090783 A1* | 4/2014 | Kim | .................. | H01J 37/3211 |
| | | | | 156/345.48 |
| 2015/0114565 A1* | 4/2015 | Kim | ...................... | H01J 37/321 |
| | | | | 118/723 R |
| 2015/0279630 A1* | 10/2015 | Kim | .................. | H01J 37/32715 |
| | | | | 156/345.37 |
| 2019/0108974 A1* | 4/2019 | Rogers | ............. | H01J 37/32449 |
| 2020/0243301 A1* | 7/2020 | Jo | ......................... | H01J 37/321 |
| 2021/0020405 A1* | 1/2021 | Ventzek | ............ | C23C 16/45544 |
| 2022/0277931 A1* | 9/2022 | Choi | ................. | H01J 37/3244 |
| 2023/0124184 A1* | 4/2023 | Choi | .................... | H01J 37/3211 |
| | | | | 315/111.21 |
| 2023/0124857 A1* | 4/2023 | Choi | ..................... | H01J 37/321 |
| | | | | 216/67 |
| 2023/0411117 A1* | 12/2023 | Choi | .................... | H01J 37/3211 |
| 2024/0203690 A1* | 6/2024 | Son | ...................... | H01J 37/3211 |

* cited by examiner

ANTENNA MEMBER AND APPARATUS FOR TREATING SUBSTRATE

CROSS-REFERENCE TO RELATED APPLICATIONS

A claim for priority under 35 U.S.C. § 119 is made to Korean Patent Application No. 10-2021-0139990 filed on Oct. 20, 2021, in the Korean Intellectual Property Office, the entire contents of which are hereby incorporated by reference.

BACKGROUND

Embodiments of the inventive concept described herein relate to a substrate treating apparatus using a plasma and an antenna member provided therein.

A deposition, an etching, a cleaning, and the like are performed on a substrate using a plasma. A substrate treating apparatus using the plasma include a CCP type which generates the plasma using an electric field and an ICP type which generates the plasma using an electromagnetic field. An apparatus of the ICP type uses an antenna member as a plasma source. An apparatus of the ICP type device generates the electromagnetic field by flowing a current to the antenna member.

According to a conventional antenna member, a potential applied to the antenna member becomes an unwanted CCP source, causing a damage to a configuration of a device such as a window (hereinafter such damage is referred to as a 'CCP damage'). As a part of the antenna member having a high potential is disposed closer to the window, the CCP damage is greater and a generated electric field distribution is not symmetrical, so a plasma uniformity is poor. To solve this problem, the antenna member is wound in an up/down direction, and the high potential is placed on a top layer and a low potential is placed on a bottom layer, but a structure forming the top layer and the bottom layer is disadvantageous in generating a high density plasma, and there is a limit to distributing a voltage.

SUMMARY

Embodiments of the inventive concept provide an antenna member and a substrate treating apparatus including the same for obtaining a high-density plasma by increasing the number of windings.

Embodiments of the inventive concept provide an antenna member and a substrate treating apparatus including the same for reducing a CCP damage applied to a window, as a voltage distribution may be efficiently performed.

Embodiments of the inventive concept provide an antenna member and a substrate treating apparatus including the same for symmetrically distributing a voltage while increasing the number of windings compared to a conventional one.

The technical objectives of the inventive concept are not limited to the above-mentioned ones, and the other unmentioned technical objects will become apparent to those skilled in the art from the following description.

The inventive concept provides an antenna member. The antenna member includes a first coil and a second coil which have a rotational symmetry to each other, and wherein the first coil includes a first supply terminal applied with a current and a first ground terminal connected to the ground, the second coil includes a second supply terminal applied with the current and a second ground terminal connected to the ground, and wherein the first coil and the second coil each include a first portion having an arc-shape and a second portion having an arc-shape which as a whole form one winding, and when seen from a side, the second portion has a relatively lower height than the first portion, and the second portion of the second coil is positioned below the first portion of the first coil, and the second portion of the first coil is positioned below the first portion of the second coil.

In an embodiment, the rotational symmetry is a symmetry of 180°.

In an embodiment, a central angle of the first portion and the second portion is 180°.

In an embodiment, the first supply terminal and the second supply terminal are each provided at the first portion.

In an embodiment, at each of the first coil and the second coil, if a portion at which the second portion extends from the first portion is based on 0°, the first supply terminal and the second supply terminal are each provided to the first portion at a position of 90° with respect to the 0°.

In an embodiment, the first coil and the second coil each include a first coil part which is winded once, and a second coil part which is winded once, and wherein the first coil part and the second coil part both include a first portion and a second portion which has a relatively lower height than the first portion when seen from a side.

In an embodiment, the second coil part is provided below an up/down direction of the first coil part.

In an embodiment, the second coil part is provided at an outer side of a radial direction of the first coil part.

In an embodiment, the first supply terminal and the first ground terminal are provided adjacent to each other, and the second supply terminal and the second ground terminal are provided adjacent to each other.

In an embodiment, the antenna member further includes a variable capacitor connecting to each of the first ground terminal and the second ground terminal.

The inventive concept provides a substrate treating apparatus. The substrate treating apparatus includes a chamber providing a treating space; a chuck member provided at the treating space and supporting a substrate; a window positioned above the chuck member; and an antenna member positioned above the window, and wherein the antenna member includes a first coil and a second coil which have a rotational symmetry to each other, and wherein the first coil includes a first supply terminal applied with a current and a first ground terminal connected to the ground, the second coil includes a second supply terminal applied with the current and a second ground terminal connected to the ground, and wherein the first coil and the second coil each include a first portion having an arc-shape and a second portion having an arc-shape which as a whole form one winding, and when seen from a side, the second portion has a relatively lower height than the first portion, and the second portion of the second coil is positioned below the first portion of the first coil, and the second portion of the first coil is positioned below the first portion of the second coil.

In an embodiment, the rotational symmetry is a symmetry of 180°.

In an embodiment, a central angle of the first portion and the second portion is 180°.

In an embodiment, the first supply terminal and the second supply terminal are each provided at the first portion.

In an embodiment, at each of the first coil and the second coil, if a portion at which the second portion extends from the first portion is based on 0°, the first supply terminal and the second supply terminal are each provided to the first portion at a position of 90° with respect to the 0°.

In an embodiment, the first coil and the second coil each include a first coil part which is winded once, and a second coil part which is winded once, and wherein the first coil part and the second coil part include a first portion and a second portion which has a relatively lower height than the first portion when seen from a side.

In an embodiment, the second coil part is provided below an up/down direction of the first coil part.

In an embodiment, the second coil part is provided at an outer side of a radial direction of the first coil part.

In an embodiment, the substrate treating apparatus further includes a variable capacitor connecting to each of the first ground terminal and the second ground terminal.

The inventive concept provides a substrate treating apparatus. The substrate treating apparatus includes a chamber having a treating space; a chuck member provided at the treating space and supporting a substrate; a window positioned above the chuck member; a gas supply part for supplying a source gas for treating the substrate to the treating space; an antenna member positioned above the window; and a power supply unit for applying a power to the antenna member, and wherein the antenna member includes a first coil and a second coil which have a rotational symmetry, and wherein the first coil and the second coil part each include a first portion which is winded once, and a second portion which is winded once, and the first coil part and the second coil part include a first portion and a second portion which has a relatively lower height than the first portion when seen from a side, the first portion and the second portion have an arc-shape which as a whole form one winding, and a central angle of the first portion and the second portion is 180°, and wherein the first coil includes a first supply terminal applied with a current and a first ground terminal connected to the ground, and the second coil includes a second supply terminal applied with the current and a second ground terminal connected to the ground, and the second portion of the second coil is provided below the first portion of the first coil, the second portion of the first coil is provided below the first portion of the second coil, and the first supply terminal and the second supply terminal are each provided at the first portion of the first coil part.

According to an embodiment of the inventive concept, a high-density plasma may be obtained by increasing the number of windings.

According to an embodiment of the inventive concept, a CCP damage applied to a window may be reduced, as a voltage distribution may be efficiently performed.

According to an embodiment of the inventive concept, a voltage may be symmetrically distributed, while increasing the number of windings compared to a conventional one.

The effects of the inventive concept are not limited to the above-mentioned ones, and the other unmentioned effects will become apparent to those skilled in the art from the following description.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
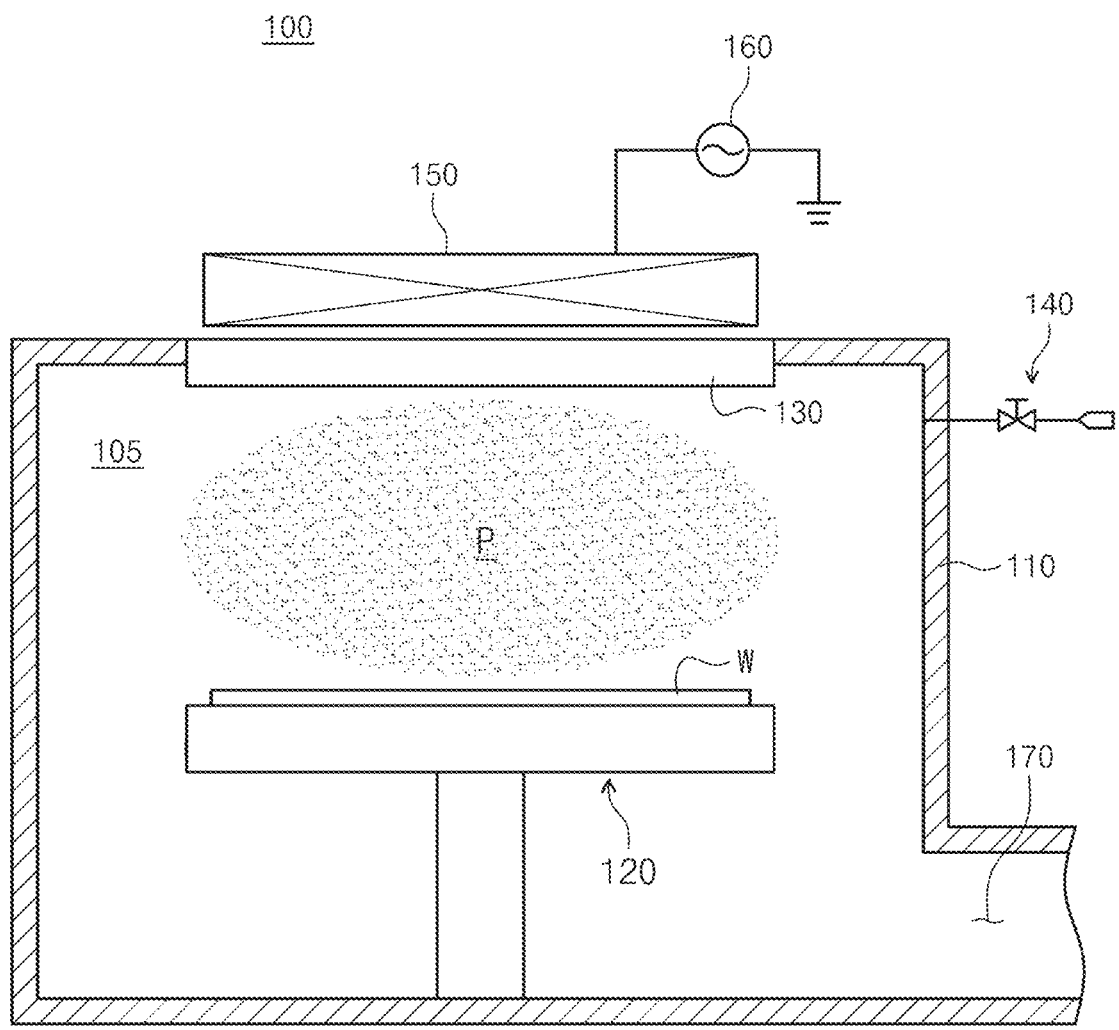
FIG. 1 schematically illustrates a substrate treating apparatus according to an embodiment.

The inventive concept may be variously modified and may have various forms, and specific embodiments thereof will be illustrated in the drawings and described in detail. However, the embodiments according to the concept of the inventive concept are not intended to limit the specific disclosed forms, and it should be understood that the present inventive concept includes all transforms, equivalents, and replacements included in the spirit and technical scope of the inventive concept. In a description of the inventive concept, a detailed description of related known technologies may be omitted when it may make the essence of the inventive concept unclear.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Hereinafter, embodiments of the inventive concept will be described in detail with reference to the accompanying drawings.

Referring to FIG. 1, the plasma treating apparatus 100 includes a chamber 110, a chuck member 120, a window 130, a gas supply unit 140, an antenna member 150, a power supply unit 160, an exhaust port 170.

The chamber 110 provides a treating space 105. A substrate W to be treated by the plasma P is disposed in the treating space 105.

The chuck member 120 supports the substrate W. The chuck member 120 is disposed in the chamber 110. The substrate W is positioned on a top surface of the chuck member 120 and is supported by the chuck member 120.

The window 130 is disposed above the chuck member 120. Typically, the window 130 is disposed above the substrate W to be treated. The window 130 is provided as a dielectric. For example, the window 130 is provided as a quartz material. An RF energy is coupled to a source gas through the window 130 to ignite and maintain a suitable plasma for a substrate treating.

The gas supply unit 140 supplies the source gas for treating the substrate W to the treating space 105.

The antenna member 150 is disposed above the dielectric window 130 and receives a power from the power supply unit 160. The antenna member 150 forms a magnetic field from the supplied power. The formed magnetic field generates a plasma P from the source gas. The antenna member 150 will be described in detail with reference to FIG. 2 to FIG. 6.

The power supply unit 160 applies the power to the antenna member 150. The power applied by the power supply unit 160 may be an RF power. IF an RF (radio frequency) current is fed from the power supply unit 160 to the antenna member 150, an inductively coupled plasma may be formed inside a process chamber from the magnetic field generated by the antenna member 150. Although not shown, an impedance matching circuit may be included in a cable to which the power supply unit 160 and the antenna member 150 are connected.

An exhaust port 170 is provided at bottom portion of the chamber 110. The exhaust port 170 is connected to a pump (not shown). A plasma and reaction by-products generated in the treating space 105 are discharged to an outside of the treating space 105 through the exhaust port 170. The pump (not shown) forcibly discharges the plasma and reaction by-products generated in the treating space 105.

Hereinafter, the antenna member 150 will be described with reference to FIG. 2 to 6.

Figure 2:
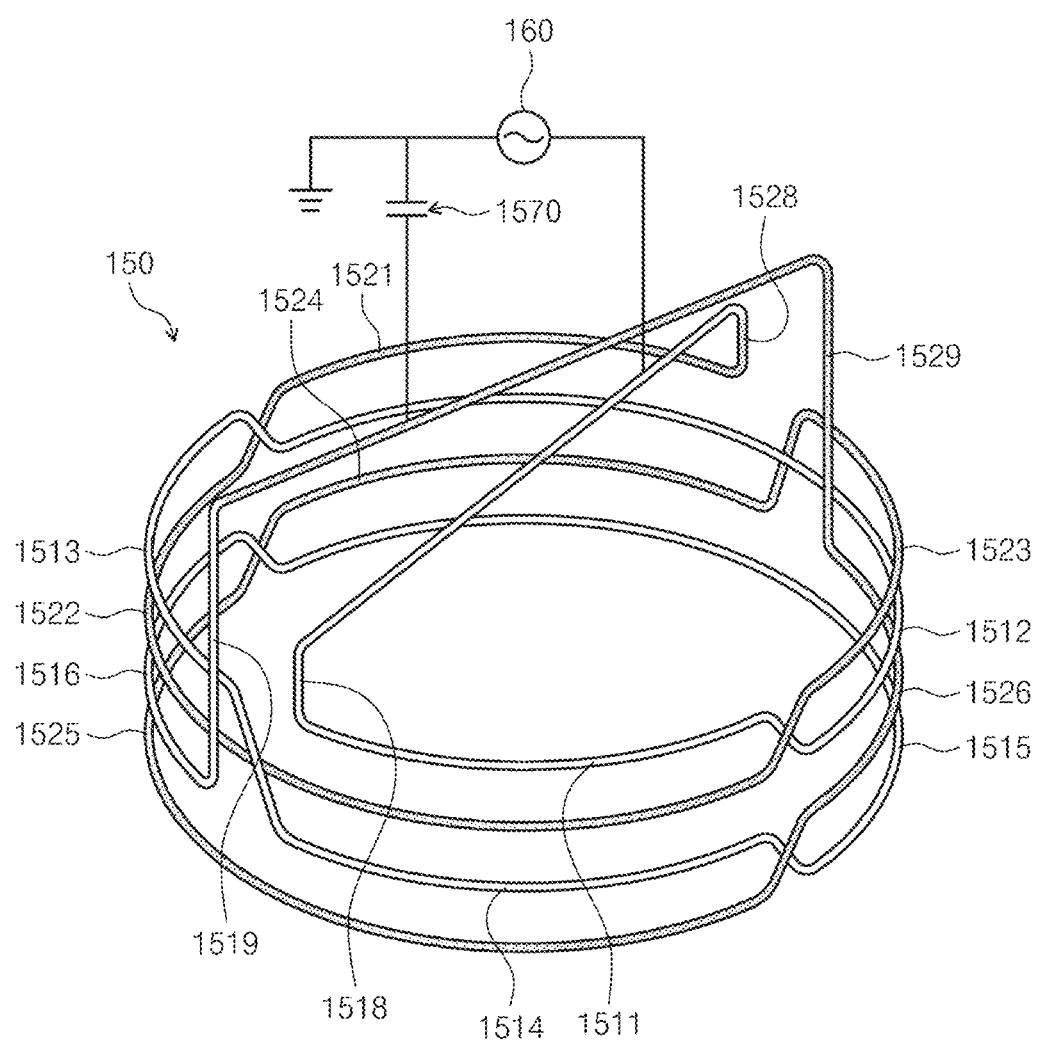
FIG. 2 is a perspective view of an antenna member 150 according to a first embodiment.
Figure 3:
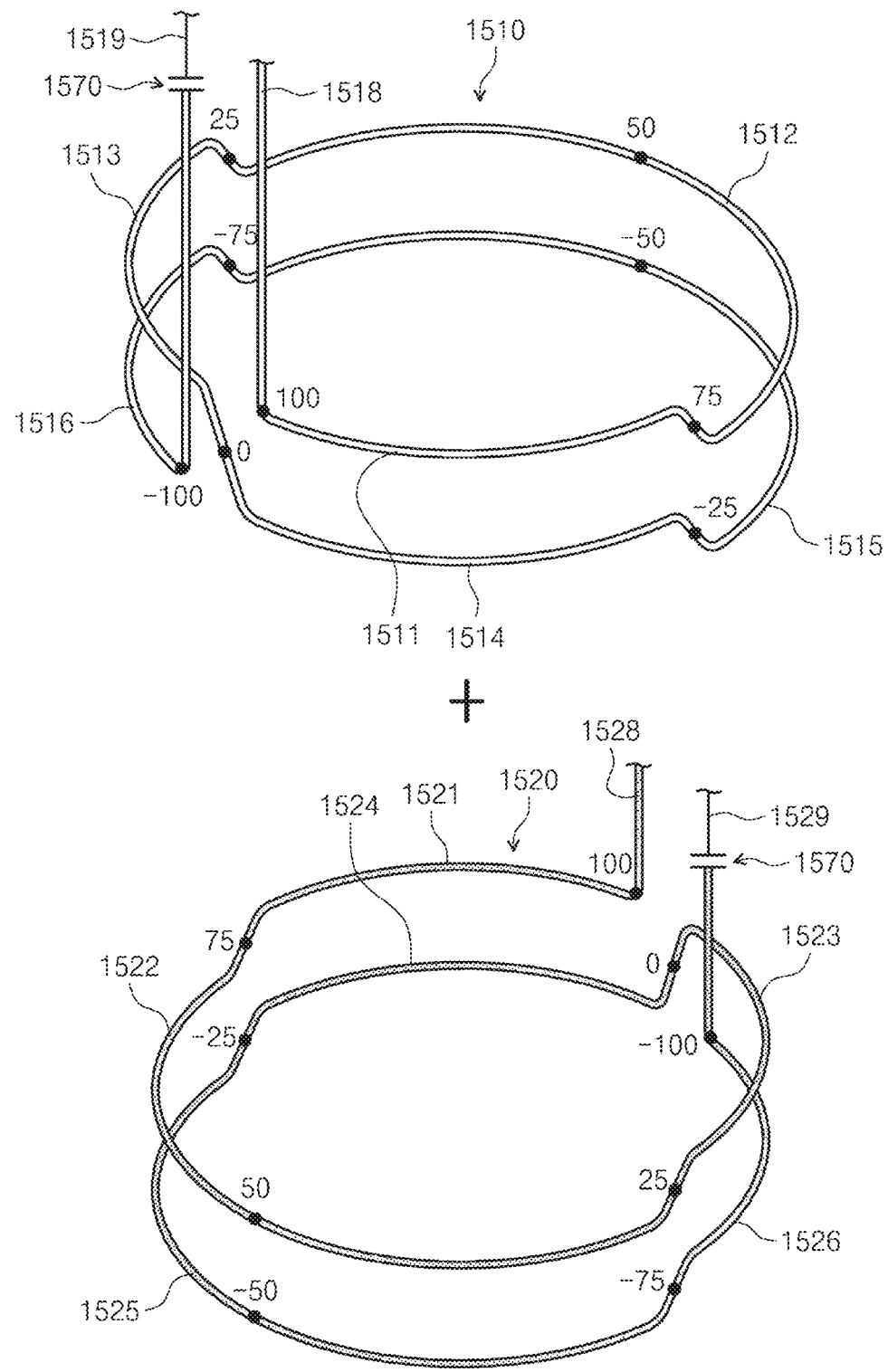
FIG. 3 is a view for explaining an aspect of use of the antenna member 150 according to the first embodiment, and for illustrating an exploded view of a first coil 1510 and a second coil 1520.

FIG. 2 is a perspective view of the antenna member 150 of a first embodiment. FIG. 3 is an exploded view illustrating a first coil 1510 and a second coil 1520 constituting the antenna member 150 of the first embodiment.

The antenna member 150 of the first embodiment will be described with reference to FIG. 2 and FIG. 3.

The antenna member 150 includes the first coil 1510 and the second coil 1520. The first coil 1510 and the second coil 1520 form a rotational symmetry with each other. In an embodiment, the first coil 1510 and the second coil 1520 form a 180° rotational symmetry with each other. According to an embodiment of the inventive concept, the first coil 1510 is composed of two windings and the second coil 1520 is composed of four windings in total.

The first coil 1510 includes a first supply terminal 1518 to which a current is applied and a first ground terminal 1519 connected to the ground. The first coil 1510 is provided as a single wire in a coil shape. The first supply terminal 1518 is an end of the first coil 1510, and the first ground terminal 1519 is the other end of the first coil 1510. The first supply terminal 1518 and the first ground terminal 1519 are provided at positions adjacent to each other.

The first coil 1510 includes a first coil part 1511, 1512, and 1513 which is wound once, and a second coil part 1514, 1515, and 1516 which is wound once. The second coil part 1514, 1515, and 1516 is provided below the first coil part 1511, 1512, and 1513 in a vertical direction.

The first coil part 1511, 1512, 1513 of the first coil 1510 includes a first portion 1511 and 1513 and a second portion 1512 which is relatively lower in height than the first portion 1511 and 1513 when viewed from a side. The first portion 1511 and 1513 and the second portion 1512 are combined with each other to form one winding as a whole. The first portion 1511 and 1513 include a 1-1 portion 1511 and a 1-2 portion 1513. One winding of the first coil part 1511, 1512, and 1513 is wound so that the 1-1 portion 1511 extending from the first supply terminal 1518 has a central angle of 90°, and then is extended to the second portion 1512 after lowering in height. The second portion 1512 is wound to form a central angle of 180° and then extends to the 1-2 portion 1513 by increasing the height again. The 1-2 portion 1513 is wound so that the central angle is 90°. The indications of the angles 90° and 180° above mean substantially 90° and 180° in consideration of a changing height, and do not mean a mathematically accurate 90° and 180°.

The second coil part 1514, 1515, and 1516 of the first coil 1510 extend from the first coil part 1511, 1512, and 1513. Specifically, the second coil part 1514, 1515, and 1516 extend from the 1-2 portion 1513. The second coil part 1514, 1515, and 1516 are disposed at a height lower than the first coil part 1511, 1512, and 1513.

The second coil part 1514, 1515, 1516 of the first coil 1510 include the first portion 1514, 1516 and the second portion 1515), which is relatively lower in height than the first portion 1514, 1516 when viewed from a side. The first portion 1514 and 1516 and the second portion 1515 are combined with each other to form a winding once as a whole. The first portion 1514 and 1516 include a 1-1 portion 1514 and a 1-2 portion 1516. One winding of the second coil part 1514, 1515, and 1516 is wound so that the 1-1 portion 1514 extending from the 1-2 portion 1513 of the first coil part 1511, 1512, and 1513 has a central angle of 90°, and then extends to the second portion 1515 by lowering the height. The second portion 1515 is wound so that the central angle thereof forms 180° and then extends to the second portion 1516 by increasing the height again. The 1-2 portion 1516 is wound so that the central angle is 90°. The first ground terminal 1519 extends from the end of the 1-2 portion 1516 of the second coil part 1514, 1515, and 1516. The indications of the angles 90° and 180° above mean substantially 90° and 180° in consideration of a changing height, and do not mean a mathematically accurate 90° and 180°.

The second coil 1520 includes a second supply terminal 1528 to which the current is applied and a second ground terminal 1529 connected to the ground. The second coil 1520 is provided as a single wire in a coil shape. The second supply terminal 1528 is an end of the second coil 1520, and the second ground terminal 1529 is the other end of the second coil 1520. The second supply terminal 1528 and the second ground terminal 1529 are provided at positions adjacent to each other.

The second coil 1520 includes a first coil part 1521, 1522, and 1523, which is wound once, and a second coil part 1524, 1525, and 1526, which is wound once. The second coil part 1524, 1525, and 1526 is provided below the first coil part 1521, 1522, and 1523 in a vertical direction.

The first coil part 1521, 1522, and 1523 of the second coil 1520 include the first portion 1521 and 1523, and the second portion 1522, which is relatively lower in height than the first portion 1521 and 1523 when viewed from a side. The first portion 1521 and 1523 and the second portion 1522 are combined with each other to form one winding as a whole. The first portion 1521 and 1523 includes a 1-1 portion 1521 and a 1-2 portion 1523. A first winding of the first coil part 1521, 1522, 1523 is wound so that the 1-1 portion 1521 extending from the second supply terminal 1528 has a central angle of 90°, and then is extended to the second portion 1522 by lowering a height. The second portion 1522 is wound to form a central angle of 180°, and then extends to the 1-2 portion 1523 by increasing a height again. The 1-2 portion 1523 is wound so that a central angle is 90°. An indication of the angles 90° and 180° above mean substantially 900 and 180° considering a changing height, and do not mean a mathematically accurate 90° and 180°.

The second coil part 1524, 1525, and 1526 of the second coil 1520 extends from the first coil part 1521, 1522, and 1523. Specifically, the second coil part 1524, 1525, and 1526 extends from the 1-2 portion 1523. The second coil part 1524, 1525, and 1526 are disposed at a lower height than the first coil part 1521, 1522, and 1523.

The second coil part 1524, 1525, and 1526 of the second coil 1520 include a first portion 1524 and 1526, and a second portion 1525 which is relatively lower in height than the first portion 1524 and 1526 when viewed from a side. The first portion 1524 and 1526 and the second portion 1525 are combined with each other to form one winding as a whole. The first portion 1524 and 1526 includes a 1-1 portion 1524 and a 1-2 portion 1526. One winding of the second coil part 1524, 1525, 1526 is wound so that the 1-1 portion 1524 extended from the 1-2 portion 1523 of the first coil part 1521, 1522, 1523 has a central angle of 90°, and then extends to the second portion 1525 by lowering a height. The second portion 1525 is wound to form a central angle of 180° and then extends to the 1-2 portion 1526 by increasing a height again. The 1-2 portion 1526 is wound so that the central angle is 90°. The second ground terminal 1529 extends from an end of the 1-2 portion 1526 of the second coil part 1524, 1525, and 1526. An indication of the angles 90° and 1800 above mean substantially 90° and 180° in consideration of a changing height, and do not mean a mathematically accurate 90° and 180°.

A second portion 1522 of the first coil part 1521, 1522, 1523 among the second coil part 1520 is disposed below the first portion 1511, 1513 of the first coil part 1511, 1512, 1513 of the first coil 1510. A second portion 1512 of the first coil part 1511, 1512, 1513 of the first coil 1510 is disposed below the first portion 1521, 1523 of the first coil part 1521, 1522, and 1523 of the second coil 1520.

A second portion 1525 of the second coil part 1524, 1525, 1526 among of the second coil part 1520 is disposed below the first portion 1514 and 1516 of the second coil part 1514, 1515, and 1516 of the first coil part 1510. A second portion 1515 of the second coil part 1514, 1515, 1516 of the first coil 1510 is disposed under the first portion 1524 and 1526 of the second coil part 1524, 1525, 1526 of the second coil 1510.

In an embodiment, if a first plane, a second plane, a third plane, and a fourth plane are planes which are lower according to their order, the first portion 1521 and 1513 of the first coil part 1521, 1522 and 1523 of the first coil 1510 and the first portion 1521 and 1523 of the first coil part 1521, 1522, and 1523 among the second coil 1520 are positioned on the first plane. A second portion 1512 of the first coil part 1511, 1512, 1513 of the first coil 1510 and a second portion 1522 of the first coil part 1521, 1522, 1523 of the second coil 1520 are positioned on the second plane. On the third plane, the first portion 1514 and 1516 of the second coil part 1514, 1515, 1516 among of the first coil 1510, and the first portion 1524 and 1526 of the second coil part 1524, 1525, and 1526 among the second coil 1520 are positioned. The second portion 1515 of the second coil part 1514, 1515, 1516 of the first coil 1510 and the second portion 1525 of the second coil part 1524, 1525, 1526 of the second coil 1520 are positioned on the fourth plane.

A variable capacitor 1570 is provided to the first ground terminal 1519 and the second ground terminal 1529, respectively. The variable capacitor 1570 functions as a balance capacitor. The variable capacitor 1570 adjusts a potential.

FIG. 3 is a view for explaining an aspect of use of the antenna member 150 according to the first embodiment, and for explaining an exploded view of the first coil 1510 and the second coil 1520. The numbers described at each position in FIG. 3 refer to an exemplary electrical potential of a nearby point.

The potential applied to the antenna member 150 becomes an undesired CCP source, causing damage to the configuration of a device such as window 130 (hereinafter the damage is referred to as a "CCP damage"). Conventionally, there is a problem of a poor plasma uniformity as a part of the antenna member 150 with a high potential is placed close to the window 130, the CCP damage is increased, and an electric field distribution is not symmetrical. To solve this problem, the antenna member 150 is wound in an up/down direction, and the high potential is disposed on a top layer and a low potential is disposed on a bottom layer, but a structure forming the top layer and the bottom layer is disadvantageous to generate a high density plasma, and there is a limit to distributing a voltage.

According to the embodiment, the high-density plasma may be obtained by increasing the number of windings. In addition, since a voltage distribution may be efficiently performed, the CCP damage applied to the window 130 may be reduced. In addition, through an arrangement of the first coil 1510 and the second coil 1520 which are symmetrical, the number of windings can be increased compared to the prior art, and the voltage is distributed symmetrically. In addition, a portion with a low potential is disposed on the bottom layer of the first coil 1510 and the second coil 1520, thereby reducing the CCP damage applied to the window 130.

For example, the RF power is applied to each of the first coil 1510 and the second coil 1520 of the antenna 150 by 200 V. The variable capacitor 1570 adjusts a neutral point (a portion with a potential of 0 V) to be positioned in a center of each of the first coil 1510 and the second coil 1520. That is, the variable capacitor 1570 adjusts the neutral point (the portion with a potential of 0V) of the first coil 1510 to be positioned in a contact part between the first coil part 1511, 1512, 1513 and the second coil part 1514, 1515, 1516. In addition, the variable capacitor 1570 adjusts the neutral point (a portion with a potential of 0 V) of the second coil 1520 to be positioned at the contact part between the first coil part 1521, 1522, 1523 and the second coil part 1524, 1525, 1526. In an embodiment, the variable capacitor 1570 adjusts the neutral point of potential to be positioned at a position of ½ a length of each of the first coil 1510 and the second coil 1520. The potential at the first supply terminal 1518 and the second supply terminal 1528 is 100V, and the potential at the first ground terminal 1519 and the second ground terminal 1529 can be adjusted to be −100V.

If the RF power is applied to the first coil 1510 and the second coil 1520, a potential applied to the second coil part 1514, 1515 among the first coil 1510, and a potential applied to the second coil part 1524, 1525, and 1526 among the second coil 1520 are canceled out.

Figure 4:
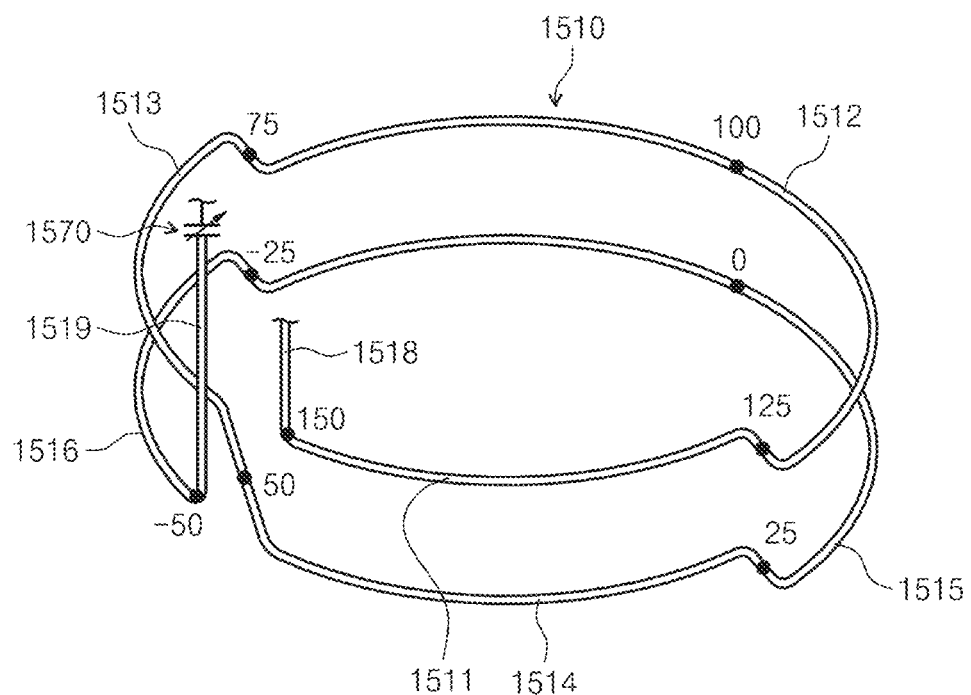
FIG. 4 is a view for explaining another aspect of use of the antenna member 150 according to the first embodiment, and for illustrating an exploded view of the first coil 1510 and the second coil 1520.
Figure 4:
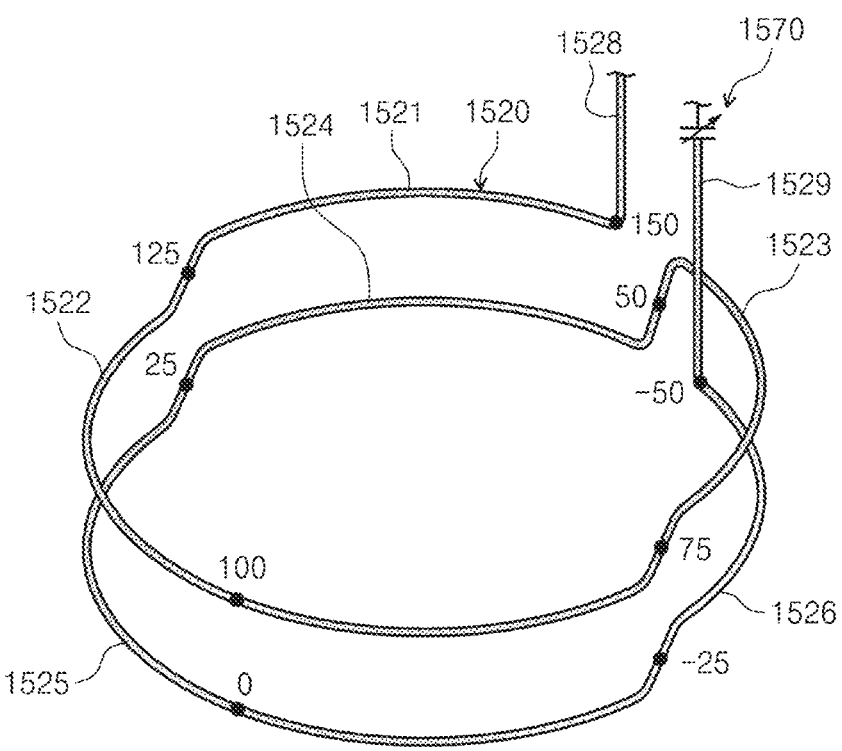

FIG. 4 is a view for explaining another aspect of use of the antenna member 150 of the first embodiment, and for explaining the first coil 1510 and the second coil 1520.

Another usage aspect of the antenna member 150 of the first embodiment will be described with reference to FIG. 4.

For example, the RF power is applied to each of the first coil 1510 and the second coil 1520 of the antenna 150 by 200 V. The variable capacitor 1570 adjusts the neutral point (the portion with a potential of 0 V) to be positioned in a center of the second coil part 1514, 1515, 1516 respectively in the first coil 1510 and the second coil 1520. That is, the variable capacitor 1570 adjusts the neutral point (the portion with a potential of 0V) to be positioned in a center of the second portion 1515 among the second coil part 1514, 1515, 1516. In an embodiment, the variable capacitor 1570 adjusts the neutral point of potential to be positioned at a position of ¾ of the length of each of the first coil 1510 and the second coil 1520. The potential at the first supply terminal 1518 and the second supply terminal 1528 is 150 V, and the potential at the first ground terminal 1519 and the second ground terminal 1529 can be adjusted to be −50 V.

Since a portion of the window 130 most affected is a portion closest to a portion of the antenna 150, it is most affected by the second coil part 1514, 1515, 1516 of the first coil 1510 and the second coil part 1524, 1525, 1526 of the second coil 1520. The potential applied to the second coil part 1514, 1515, 1516 of the first coil 1510 and the potential applied to the second coil part 1524, 1525, 1526 of the second coil 1520 are canceled out while being offset.

A potential of a portion of the first coil 1510 in contact with the 1-1 portion 1514 and the second portion 1515 of the second coil part 1514, 1515, and 1516 is 25 V. A potential of a portion contacting the second part 1525 and the 1-2 part 1526 of the second coil part 1524, 1525, and 1526 among the second coil 1520 adjacent thereto is −25V. A sum of −25V and 25V is 0V, so that the voltage on the bottom window 130 is 0V, so that the CCP damage is minimized.

In addition, the potential of the second portion 1515 of the second coil part 1514, 1515, 1516 of the first coil 1510 and a potential of a central part of the second portion 1525 of the second coil part 1524, 1525, 1526 of the second coil 1520 is 0 V, so there is no CCP damage. In addition, at the opposite part, a sum of 50V and −50V becomes 0V, so that the CCP damage is minimized.

A sum of the second coil part 1514, 1515, 1516 of the first coil 1510 and the second coil part 1524, 1525, 1526 of the second coil 1520 is canceled out at 0 V, which is the closest to the window 130 and has the greatest influence regarding CCP damage. As a result, the CCP damage generated in the window 130 may be effectively reduced.

Figure 5:
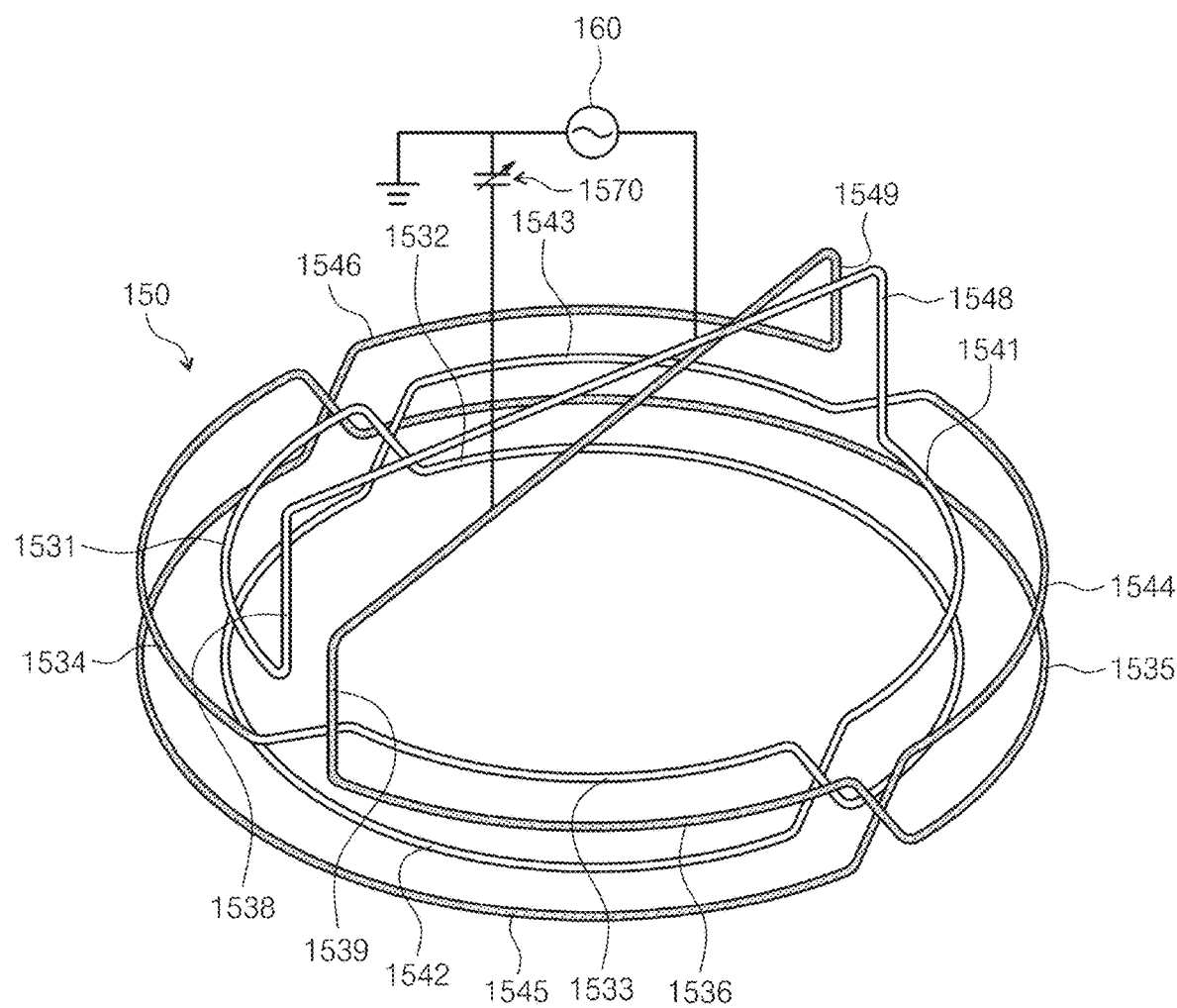
FIG. 5 is a perspective view of the antenna member 150 of a second embodiment.
Figure 6:
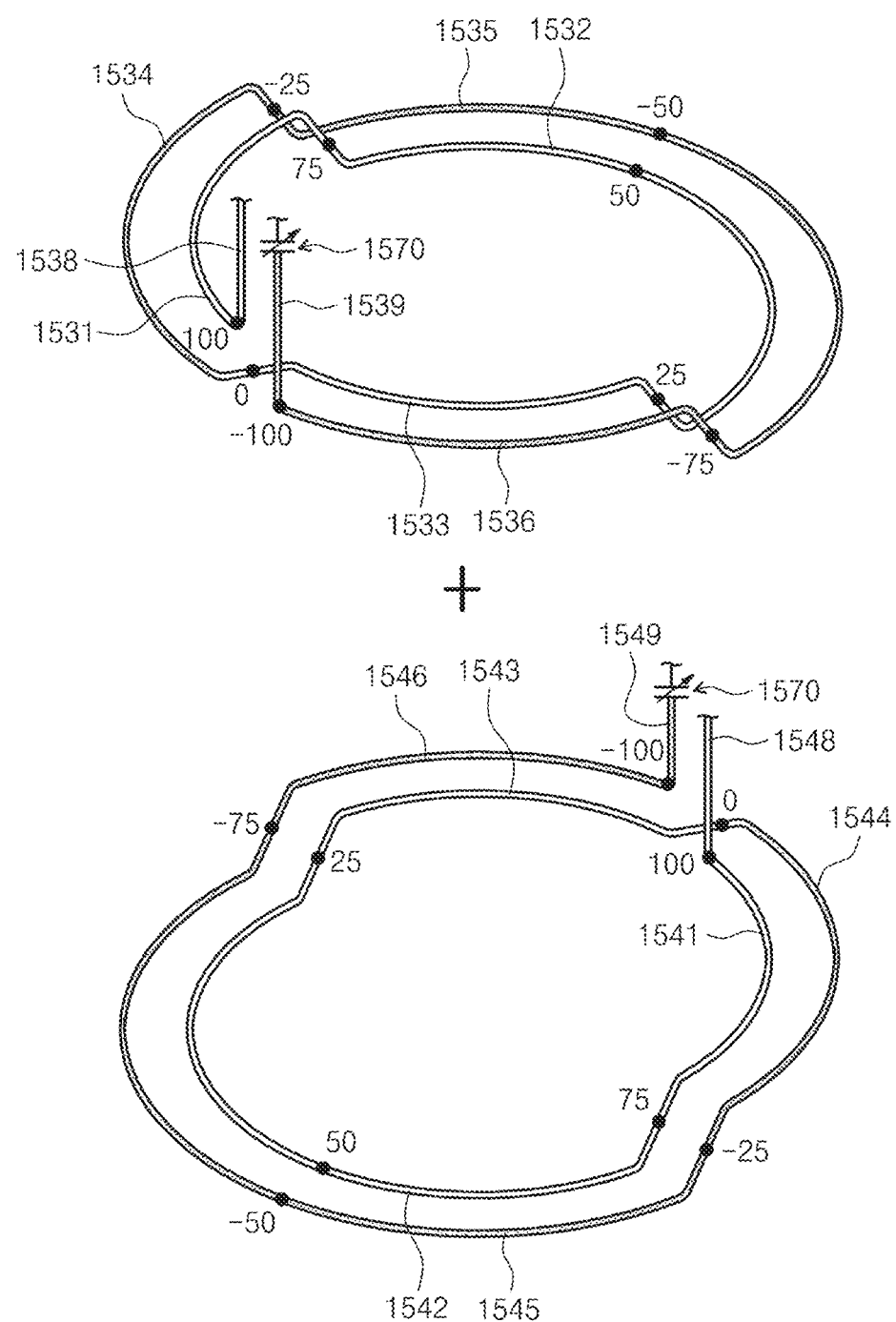
FIG. 6 is a view explaining an aspect of use of the antenna member 150 of the second embodiment, and for illustrating an exploded view of the first coil 1530 and the second coil 1540.

FIG. 5 is a perspective view of the antenna member 150 of the second embodiment. FIG. 6 is an exploded view illustrating the first coil 1530 and the second coil 1540 forming the antenna member 150 of the second embodiment. The antenna member 150 of the second embodiment will be described with reference to FIG. 5 and FIG. 6. In the description of the second embodiment, the same configuration as that of the first embodiment is replaced by the description of the first embodiment using the same reference numeral as the reference numeral in the first embodiment.

The antenna member 150 includes a first coil 1530 and a second coil 1540. The first coil 1530 and the second coil 1540 form a rotational symmetry with each other. In an embodiment, the first coil 1530 and the second coil 1540 form a 180° rotational symmetry with each other. According to an embodiment of the inventive concept, the first coil 1530 is composed of two windings and the second coil 1540 is composed of four windings in total.

The first coil 1530 includes a first supply terminal 1538 to which a current is applied and a first ground terminal 1539 connected to the ground. The first coil 1530 is provided as a single wire in a coil shape. The first supply terminal 1538 is an end of the first coil 1530, and the first ground terminal 1539 is the other end of the first coil 1530. The first supply terminal 1538 and the first ground terminal 1539 are provided at positions adjacent to each other.

The first coil 1530 includes a first coil part 1531, 1532, and 1533 wound once, and a second coil part 1534, 1535, and 1536 wound once. The second coil part 1534, 1535, and 1536 are provided outside of a direction of a radius of the first coil part 1531, 1532, and 1533.

The first coil part 1531, 1532, and 1533 of the first coil 1530 include a first portion 1531 and 1533, and a second portion 1532, which is relatively lower in height than the first portion 1531 and 1533 when viewed from a side. The first portion 1531 and 1533 and the second portion 1532 are combined with each other to form one winding once as a whole. The first portion 1531 and 1533 include a 1-1 portion 1531 and a 1-2 portion 1533. One winding of the first coil part 1531, 1532, and 1533 is wound so that the 1-1 portion 1531 extending from the first supply terminal 1538 has a central angle of 90°, and then is extended to the second portion 1532 by lowering a height. The second portion 1532 is wound so that the central angle thereof forms 180°, and then increases a height again to extend to the 1-2 portion 1533. The 1-2 portion 1533 is wound so that the central angle is 90°. The indications of the angles 90° and 180° above mean substantially 90° and 180° in consideration of a changing height, and do not mean a mathematically accurate 90° and 180°.

The second coil part 1534, 1535, and 1536 of the first coil 1530 extend from the first coil part 1531, 1532, and 1533. Specifically, the second coil part 1534, 1535, and 1536 extend from the 1-2 portion 1533. The second coil part 1534, 1535, and 1536 are provided outside of a direction of a radius of the first coil part 1531, 1532, and 1533.

The second coil part 1534, 1535, and 1536 of the first coil 1530 include the first portion 1534 and 1536 and the second portion 1535, which is relatively lower in height than the first portion 1534 and 1536 when viewed from a side. The first portion 1534 and 1536 and the second portion 1535 are combined with each other to form one winding as a whole. The first portion 1534 and 1536 include a 1-1 portion 1534 and a 1-2 portion 1536. One winding of the second coil part 1534, 1535, and 1536 is wound so that the 1-1 portion 1534 extending from the 1-2 portion 1533 of the first coil part 1531, 1532, and 1533 has a central angle of 90°, and then is extended to the second portion 1535 by lowering a height. The second portion 1535 is wound to form a central angle of 180° and then extends to the 1-2 portion 1536 by increasing the height again. The 1-2 portion 1536 is wound so that the central angle is 90°. The first ground terminal 1539 extends from an end of the 1-2 portion 1536 of the second coil part 1534, 1535, and 1536. The indications of the angles 90° and 180° above mean substantially 90° and 180° in consideration of a changing height, and do not mean a mathematically accurate 90° and 180°.

The second coil 1540 includes a second supply terminal 1548 to which the current is applied and a second ground terminal 1549 connected to the ground. The second coil 1540 is provided as a single wire in a coil shape. The second supply terminal 1548 is an end of the second coil 1540, and the second ground terminal 1549 is the other end of the second coil 1540. The second supply terminal 1548 and the second ground terminal 1549 are provided at positions adjacent to each other.

The second coil 1540 includes a first coil part 1541, 1542, and 1543, which is wound once, and a second coil part 1544, 1545, and 1546 which is wound once. The second coil part 1544, 1545, and 1546 are provided outside the first coil part 1541, 1542, and 1543.

The first coil part 1541 1542, and 1543 of the second coil 1540 include a first portion 1541 and 1543 and a second portion 1542, which is relatively lower in height than the first portion 1541 and 1543 when viewed from a side. The first portion 1541 and 1543 and the second portion 1542 are combined with each other to form one winding as a whole. The first portion 1541 and 1543 include a 1-1 portion 1541 and a 1-2 portion 1543. One winding of the first coil part 1541, 1542, and 1543 is wound so that the 1-1 portion 1541, which extends from the second supply terminal 1548, has a central angle of 90°, and then is extended to the second portion 1542 by lowering a height. The second portion 1542 is wound to form a central angle of 180° and then extends to the 1-2 portion 1543 by increasing the height again. The 1-2 portion 1543 is wound so that the central angle is 90°. The indications of the angles 90° and 180° above mean substantially 90° and 180° in consideration of a changing height, and do not mean a mathematically accurate 90° and 180°.

The second coil part 1544, 1545, and 1546 of the second coil 1540 extend from the first coil part 1541, 1542, and 1543. Specifically, the second coil part 1544, 1545, and 1546 extend from the 1-2 portion 1543. The second coil part 1544, 1545, and 1546 are provided outside the first coil part 1541, 1542, and 1543.

The second coil part 1544, 1545, 1546 of the second coil 1540 include the first portion 1544, 1546, and the second portion 1545, which is relatively lower in height than the first portion 1544, 1546 when viewed from a side. The first portion 1544 and 1546 and the second portion 1545 are combined with each other to form one winding as a whole. The first portion 1544 and 1546 include a 1-1 portion 1544 and a 1-2 portion 1546. One winding of the second coil part 1544, 1545, 1546 is wound so that the 1-1 portion 1544, which extends from the 1-2 portion 1543 of the first coil part 1541, 1542, and 1543, has a central angle of 90°, and then extends to the second portion 1545 by lowering a height. The second portion 1545 is wound to form a central angle of 180° and then extends to the 1-2 portion 1546 by increasing the height again. The 1-2 portion 1546 is wound so that the central angle is 90°. The second ground terminal 1549 extends from the end of the 1-2 portion 1546 of the second coil part 1544, 1545, and 1546. The indications of the angles 90° and 180° above mean substantially 90° and 180° in consideration of a changing height, and do not mean a mathematically accurate 90° and 180°.

A second portion 1542 of the first coil part 1541, 1542, and 1543 among the second coil 1540 is disposed under the first portion 1531 and 1533 of the first coil part 1531, 1532, and 1533 among the first coil 1530. The second portion 1532 of the first coil part 1531, 1532, and 1533, among the first coil 1530 is disposed below the first portion 1541, 1542 of the first coil part 1541, 1542, and 1543 among the second coil 1540.

The second portion 1545 of the second coil part 1544, 1545, 1546 among the second coil part 1540 is disposed under the first portion 1534 and 1536 of the second coil part 1534, 1535, and 1536 among the first coil 1530. The second portion 1535 of the second coil part 1534, 1535, 1536 among the first coil 1530 is disposed under the first portion 1544, 1545, 1546 of the second coil 1540, 1544, 1546 among the second coil 1540.

In an embodiment, if the second plane is lower than the first plane, the first portion 1531 and 1533 of the first coil part 1531, 1532, and 1533 among the first coil 1530, the first portion 1541 and 1543 of the second coil part 1541, 1542 and 1543 among the first coil 1530, the first portion 1541 and 1543 of the first coil part 1541, 1542, and 1543 among the second coil 1540, and the first portion 1544 and 1546 of the second coil part 1544, 1545, 1546 among the second coil 1540 are on the first plane. The second portion 1532 of the first coil part 1534, 1532, 1533 among the first coil 1530 is positioned at the second plane, the first portion 1534 and 1536 of the second coil part 1534, 1535, and 1536 among the first coil 1530, the first portion 1534 and 1536 of the second coil part 1534, 1535, and 1536 among the first coil 1530, the second portion 1542 of the first coil part 1541, 1542, and 1543 among the second coil 1540, and the second portion 1545 of the second coil part 1544, 1545, and 1546 among the second coil 1540 are positioned at the second plane.

FIG. 6 is a view explaining an aspect of use of the antenna member 150 of the second embodiment, and illustrating an exploded view of the first coil 1530 and the second coil 1540. The numbers described at each position of FIG. 6 refer to an exemplary electrical potential of a nearby point.

According to the embodiment, the high-density plasma may be obtained by increasing the number of windings. In addition, since a voltage distribution may be efficiently performed, the CCP damage applied to the window 130 may be reduced. In addition, through an arrangement of the first coil 1530 and the second coil 1540 which are symmetrical, the number of windings can be increased compared to the prior art, and the voltage is distributed symmetrically. In addition, a portion with a low potential is disposed on the bottom layer of the first coil 1530 and the second coil 1540, thereby reducing the CCP damage applied to the window 130.

The variable capacitor 1570 adjusts the neutral point (the portion with the potential of 0 V) to be positioned in a middle portion of each of the first coil 1530 and the second coil 1540. That is, the variable capacitor 1570 adjusts the neutral point (the portion where the potential is 0V) of the first coil 1530 to be positioned in a contact part between the first coil part 1531, 1532, 1533 and the second coil part 1534, 1535, 1536. In addition, the variable capacitor 1570 adjusts the neutral point (the portion with the potential of 0 V) of the second coil 1540 to be positioned at a portion where the first coil part 1541 1542, 1543 and the second coil part 1544, 1545, 1546 are in contact with each other. In an embodiment, the variable capacitor 1570 adjusts the neutral point of potential to be positioned at a position that is ½ of a length of each of the first coil 1530 and the second coil 1540. The potential at the first supply terminal 1538 and the second supply terminal 1548 is 100V, and the potential at the first ground terminal 1539 and the second ground terminal 1549 can be adjusted to be −100V.

If the RF power is applied to the first coil 1530 and the second coil 1540, the potential applied to the first coil 1530 and the potential applied to the second coil 1540 are canceled out while being offset. For example, a potential of a portion contacting the 1-1 portion 1531 and the second portion 1532 of the first coil part 1531, 1532, and 1533 among the first coil 1530 is 75 V. A potential of a portion contacting the 1-1 portion and the second portion 1535 of the second coil part 1534, 1535, and 1536 among the first coil 1530 adjacent thereto is −25V. In addition, a potential of a portion of the second coil part 1541 1542, and 1543 adjacent thereto in contact with the second portion 1542 and 1543 of the first coil part 1540, is 25 V. Among the second coil 1540 which is adjacent, a potential at which the second portion 1545 and the 1-2 portion 1546 of the second coil part 1544, 1545 contact is −75 V. The sum of these is 0 V, and most of them are canceled out at the position of the window 130.

In addition, the potential applied to the second portion 1532 of the first coil part 1531, 1532, 1533 of the first coil 1530 is 50V, and the potential applied to the second portion 1535 of the second coil part 1534, 1535, 1536 is −50V, and the sum of them becomes 0V and they are canceled out. This is the same in the second coil 1540. As a result, the CCP damage generated in the window 130 may be effectively reduced.

The effects of the inventive concept are not limited to the above-mentioned effects, and the unmentioned effects can be clearly understood by those skilled in the art to which the inventive concept pertains from the specification and the accompanying drawings.

Although the preferred embodiment of the inventive concept has been illustrated and described until now, the inventive concept is not limited to the above-described specific embodiment, and it is noted that an ordinary person in the art, to which the inventive concept pertains, may be variously carry out the inventive concept without departing from the essence of the inventive concept claimed in the claims and the modifications should not be construed separately from the technical spirit or prospect of the inventive concept.

What is claimed is:

1. An antenna member comprising a first coil and a second coil which have a rotational symmetry to each other, and
   wherein the first coil includes a first supply terminal applied with a current and a first ground terminal connected to the ground, the second coil includes a second supply terminal applied with the current and a second ground terminal connected to the ground, and
   wherein the first coil and the second coil each include a first portion having an arc-shape and a second portion having an arc-shape which as a whole form one winding,
   when seen from a side, the second portion has a relatively lower height than the first portion,
   the second portion of the second coil is positioned below the first portion of the first coil, and the second portion of the first coil is positioned below the first portion of the second coil, and
   wherein a central angle of the first portion and the second portion is 180°.

2. The antenna member of claim 1, wherein the rotational symmetry is a symmetry of 180°.

3. The antenna member of claim 1, wherein the first supply terminal and the second supply terminal are each provided at the first portion of the first coil and the second coil.

4. The antenna member of claim 1, wherein at each of the first coil and the second coil, if a portion at which the second portion extends from the first portion is based on 0°, the first supply terminal and the second supply terminal are each provided to the first portion at a position of 90° with respect to the 0°.

5. The antenna member of claim 1, wherein the first coil and the second coil each include a first coil part which is winded once, and a second coil part which is winded once, and
   wherein the first coil part and the second coil part both include a first portion and a second portion which has a relatively lower height than the first portion when seen from a side.

6. The antenna member of claim 5, wherein the second coil part is provided below an up/down direction of the first coil part.

7. The antenna member of claim 5, wherein the second coil part is provided at an outer side of a radial direction of the first coil part.

8. The antenna member of claim 1, wherein the first supply terminal and the first ground terminal are provided adjacent to each other, and the second supply terminal and the second ground terminal are provided adjacent to each other.

9. The antenna member of claim 1, further comprising a variable capacitor connecting to each of the first ground terminal and the second ground terminal.

10. A substrate treating apparatus comprising:
    a chamber providing a treating space;
    a chuck member provided at the treating space and supporting a substrate;
    a window positioned above the chuck member; and
    an antenna member positioned above the window, and
    wherein the antenna member includes a first coil and a second coil which have a rotational symmetry to each other, and
    wherein the first coil includes a first supply terminal applied with a current and a first ground terminal connected to the ground, the second coil includes a second supply terminal applied with the current and a second ground terminal connected to the ground, and
    wherein the first coil and the second coil each include a first portion having an arc-shape and a second portion having an arc-shape which as a whole form one winding,
    when seen from a side, the second portion has a relatively lower height than the first portion,
    the second portion of the second coil is positioned below the first portion of the first coil, and the second portion of the first coil is positioned below the first portion of the second coil, and
    wherein a central angle of the first portion and the second portion is 180°.

11. The substrate treating apparatus of claim 10, wherein the rotational symmetry is a symmetry of 180°.

12. The substrate treating apparatus of claim 10, wherein the first supply terminal and the second supply terminal are each provided at the first portion of the first coil and the second coil.

13. The substrate treating apparatus of claim 10, wherein at each of the first coil and the second coil, if a portion at which the second portion extends from the first portion is based on 0°, the first supply terminal and the second supply terminal are each provided to the first portion at a position of 90° with respect to the 0°.

14. The substrate treating apparatus of claim 10, wherein the first coil and the second coil each include a first coil part which is winded once, and a second coil part which is winded once, and
    wherein the first coil part and the second coil part include a first portion and a second portion which has a relatively lower height than the first portion when seen from a side.

15. The substrate treating apparatus of claim 14, wherein the second coil part is provided below an up/down direction of the first coil part.

16. The substrate treating apparatus of claim 14, wherein the second coil part is provided at an outer side of a radial direction of the first coil part.

17. The substrate treating apparatus of claim 10 further comprising a variable capacitor connecting to each of the first ground terminal and the second ground terminal.

18. A substrate treating apparatus comprising:
a chamber having a treating space;
a chuck member provided at the treating space and supporting a substrate;
a window positioned above the chuck member;
a gas supply part for supplying a source gas for treating the substrate to the treating space;
an antenna member positioned above the window; and
a power supply unit for applying a power to the antenna member, and
wherein the antenna member includes a first coil and a second coil which have a rotational symmetry, and
wherein the first coil and the second coil each include a first coil part which is winded once, and a second coil part which is winded once, and
the first coil part and the second coil part include a first portion and a second portion which has a relatively lower height than the first portion when seen from a side, the first portion and the second portion have an arc-shape which as a whole form one winding, and a central angle of the first portion and the second portion is 180°, and wherein the first coil includes a first supply terminal applied with a current and a first ground terminal connected to the ground, and the second coil includes a second supply terminal applied with the current and a second ground terminal connected to the ground, and the second portion of the second coil is provided below the first portion of the first coil, the second portion of the first coil is provided below the first portion of the second coil, and the first supply terminal and the second supply terminal are each provided at the first portion of the first coil part.

* * * * *